United States Patent [19]
Dennison et al.

[11] Patent Number: 5,650,350
[45] Date of Patent: Jul. 22, 1997

[54] SEMICONDUCTOR PROCESSING METHOD OF FORMING A STATIC RANDOM ACCESS MEMORY CELL AND STATIC RANDOM ACCESS MEMORY CELL

[75] Inventors: Charles H. Dennison, Meridian; Ken Marr, Boise, both of Id.

[73] Assignee: Micron Technology, Inc., Boise, Id.

[21] Appl. No.: 514,106

[22] Filed: Aug. 11, 1995

[51] Int. Cl.$^6$ .................................................. H01L 21/8244
[52] U.S. Cl. .................................... 437/52; 437/48; 437/45
[58] Field of Search ...................... 437/45, 52, 48

[56] References Cited

U.S. PATENT DOCUMENTS

| | | | |
|---|---|---|---|
| Re. 29,660 | 6/1978 | Armstrong | 437/45 |
| 3,895,966 | 7/1975 | MacDougall et al. | 148/1.5 |
| 4,422,885 | 12/1983 | Brower et al. | 437/45 |
| 4,928,156 | 5/1990 | Alvis et al. | 357/23.4 |
| 5,045,898 | 9/1991 | Chen et al. | 357/23.11 |
| 5,134,447 | 7/1992 | Ng et al. | 357/23.4 |
| 5,266,510 | 11/1993 | Lee | 437/44 |
| 5,362,981 | 11/1994 | Sato et al. | 257/371 |
| 5,396,096 | 3/1995 | Akamatsu et al. | 437/45 |
| 5,407,849 | 4/1995 | Khambaty et al. | 437/45 |
| 5,448,093 | 9/1995 | Kusunoki et al. | 257/327 |

OTHER PUBLICATIONS

"Novel Germanium/Boron Channel–Stop Implantation for Submicron CMOS", by James R. Pfiester and John R. Alvis, 1987, IEEE IDEM Digest.

"A Highly Practical Modified LOCOS Isolation Technology for the 256 Mbit DRAM", by D.H. Ahn et al., IEEE, 1994, pp. 28.3.1–28.3.4.

Primary Examiner—Tom Thomas
Assistant Examiner—Toniae M. Thomas
Attorney, Agent, or Firm—Wells, St. John, Roberts, Gregory & Matkin, P.S.

[57] ABSTRACT

A semiconductor processing method of forming a static random access memory cell having an n-channel access transistor includes, providing a bulk semiconductor substrate; patterning the substrate for definition of field oxide regions and active area regions for the n-channel access transistor; subjecting the patterned substrate to oxidizing conditions to form a pair of field oxide regions and an intervening n-channel access transistor active area therebetween, the field oxide regions having respective bird's beak regions extending into the n-channel access transistor active area, the n-channel access transistor active area defining a central region away from the bird's beak regions; and conducting a p-type $V_T$ ion implant into the n-channel active area using the field oxide bird's beak region as an implant mask to concentrate the $V_T$ implant in the central region of the active area. A semiconductor device includes, a substrate; an n-type transistor on the substrate; and field oxide surrounding the transistor, the transistor having an active area including a central region and a peripheral region with respect to the field oxide, the transistor having a p-type $V_T$ ion implant which is more concentrated in the central region than in the peripheral region.

39 Claims, 17 Drawing Sheets

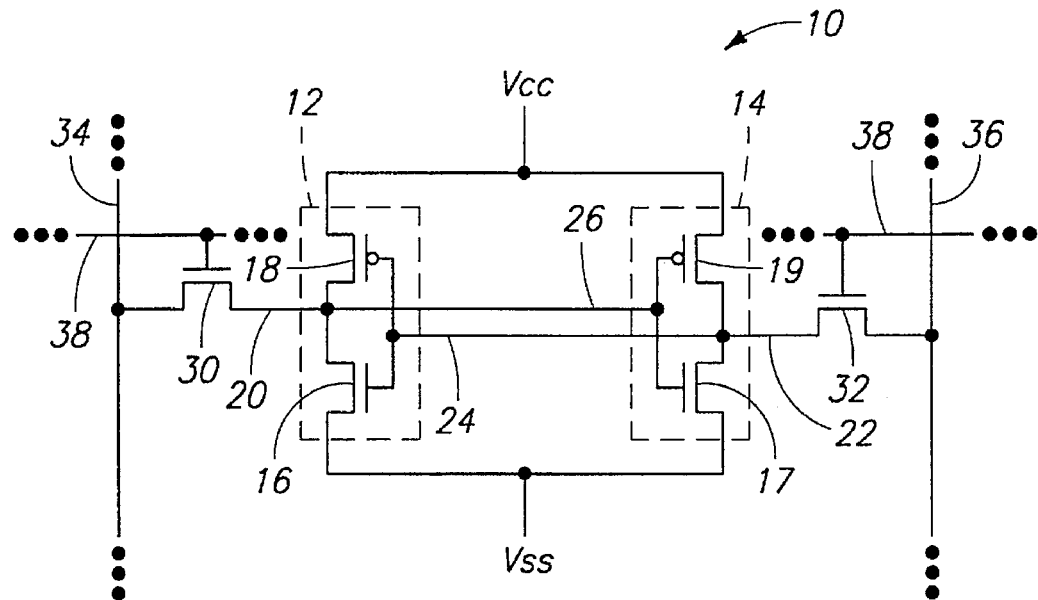
_FIG. 1_
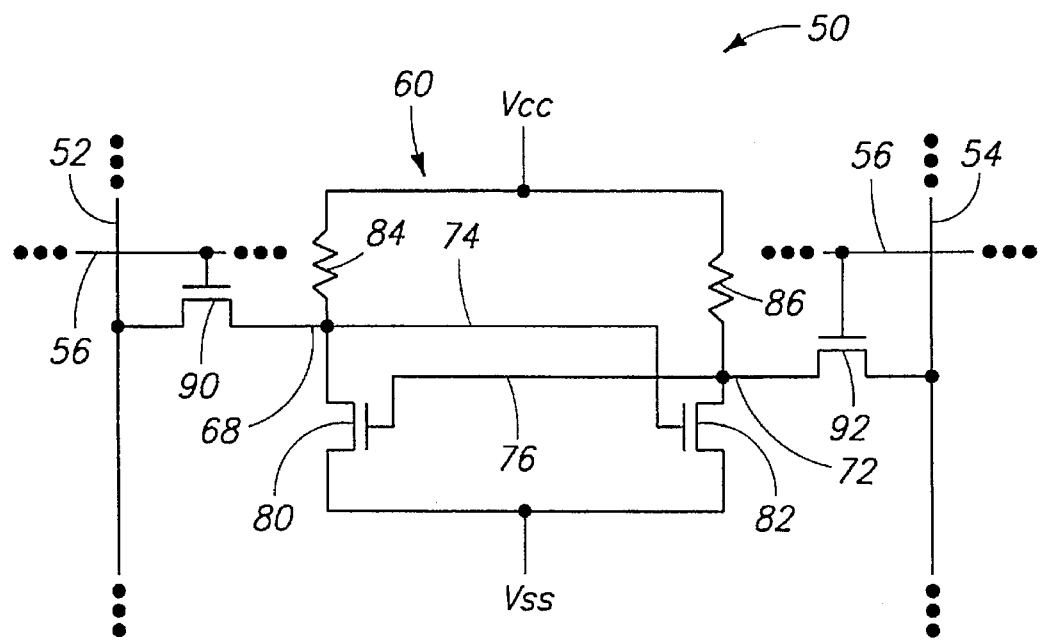
_FIG. 2_

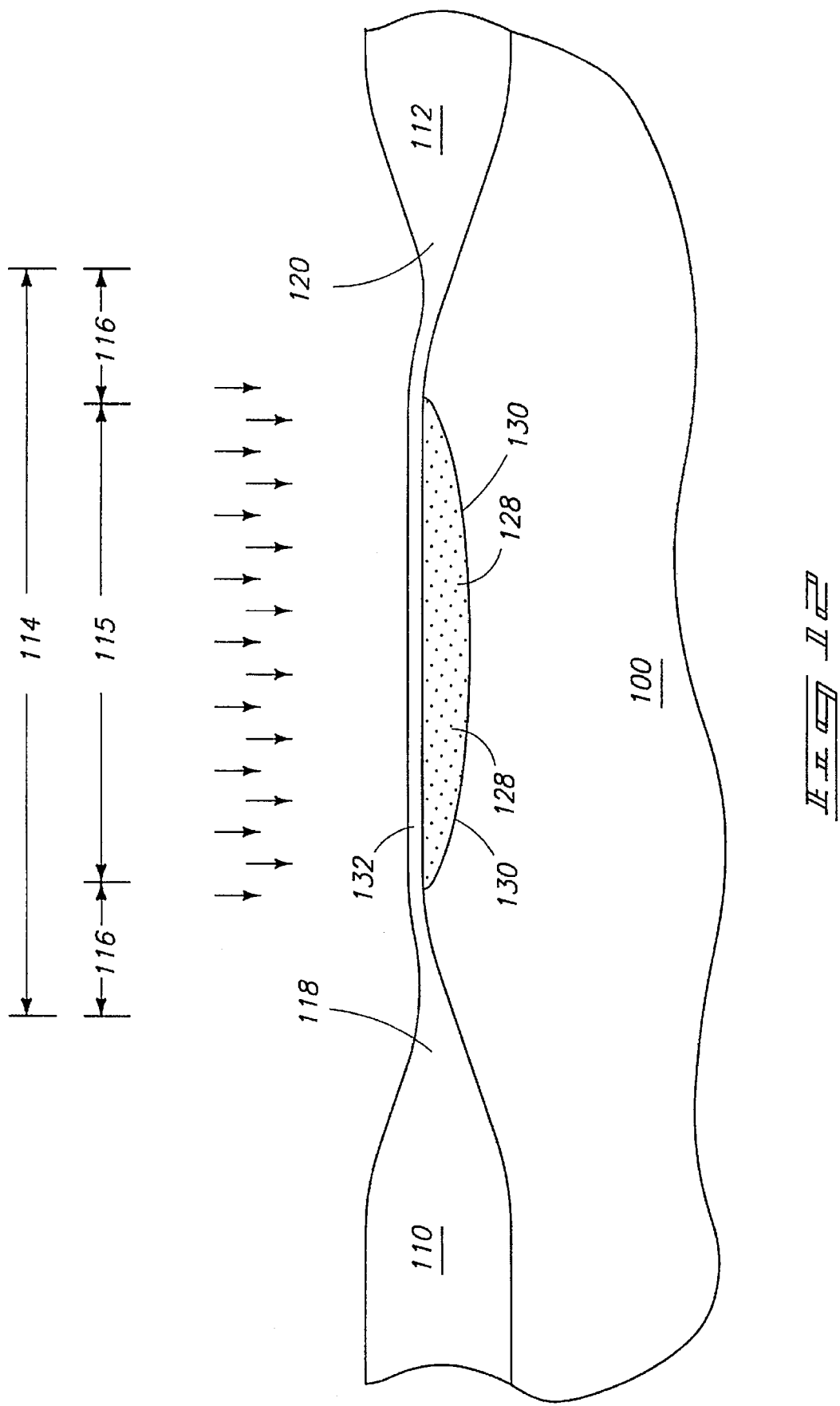

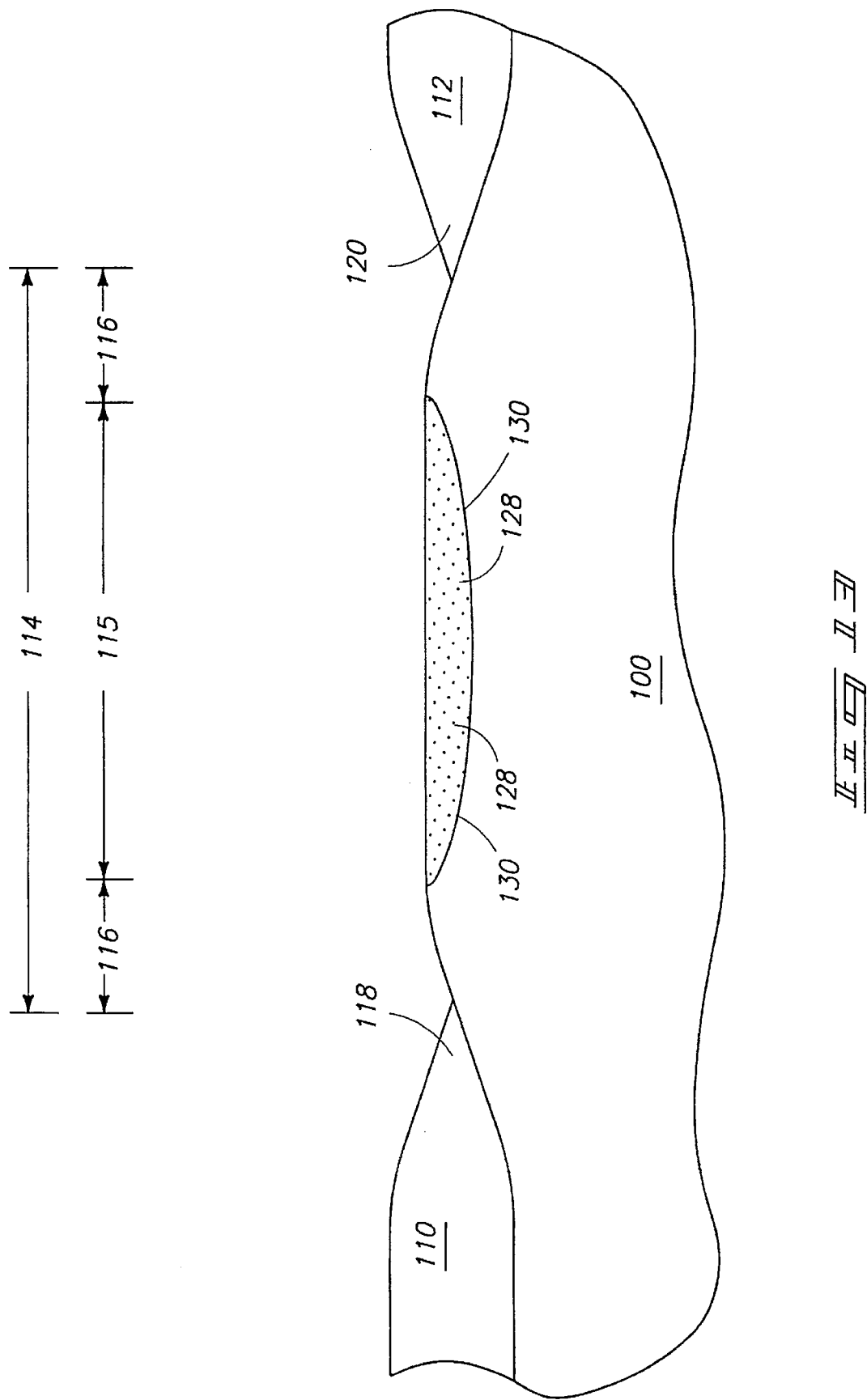

SEMICONDUCTOR PROCESSING METHOD OF FORMING A STATIC RANDOM ACCESS MEMORY CELL AND STATIC RANDOM ACCESS MEMORY CELL

TECHNICAL FIELD

This invention relates to non-volatile static memory devices.

BACKGROUND OF THE INVENTION

One known type of static read/write memory cell is a high-density static random access memory (SRAM). A static memory cell is characterized by operation in one of two mutually-exclusive and self-maintaining operating states. Each operating state defines one of the two possible binary bit values, zero or one. A static memory cell typically has an output which reflects the operating state of the memory cell. Such an output produces a "high" voltage to indicate a "set" operating state. The memory cell output produces a "low" voltage to indicate a "reset" operating state. A low or reset output voltage usually represents a binary value of zero, while a high or set output voltage represents a binary value of one.

A static memory cell is said to be bistable because it has two stable or self-maintaining operating states, corresponding to two different output voltages. Without external stimuli, a static memory cell will operate continuously in a single one of its two operating states. It has internal feedback to maintain a stable output voltage, corresponding to the operating state of the memory cell, as long as the memory cell receives power.

The two possible output voltages produced by a static memory cell correspond generally to upper ($V_{cc}$-internal-$V_T$) and lower ($V_{ss}$) circuit supply voltages. Intermediate output voltages, between the upper ($V_{cc}$-$V_T$) and lower ($V_{ss}$) circuit supply voltages, generally do not occur except for during brief periods of memory cell power-up and during transitions from one operating state to the other operating state.

The operation of a static memory cell is in contrast to other types of memory cells such as dynamic cells which do not have stable operating states. A dynamic memory cell can be programmed to store a voltage which represents one of two binary values, but requires periodic reprogramming or "refreshing" to maintain this voltage for more than very short time periods.

A dynamic memory cell has no internal feedback to maintain a stable output voltage. Without refreshing, the output of a dynamic memory cell will drift toward intermediate or indeterminate voltages, resulting in loss of data. Dynamic memory cells are used in spite of this limitation because of the significantly greater packaging densities which can be attained. For instance, a dynamic memory cell can be fabricated with a single MOSFET transistor, rather than the six transistors typically required in a static memory cell. Because of the significantly different architectural arrangements and functional requirements of static and dynamic memory cells and circuits, static memory design has developed along generally different paths than has the design of dynamic memories.

Implementing a static memory cell on an integrated circuit involves connecting isolated circuit components or devices, such as inverters and access transistors, through specific electrical paths. When fabricating integrated circuits into a semiconductor substrate, devices within the substrate must be electrically isolated from other devices within the substrate. The devices are subsequently interconnected to create specific desired circuit configurations.

One common technique for isolating devices is referred to as LOCOS Isolation (for LOCal Oxidation of Silicon), which involves the formation of a semi-recessed oxide in the non-active (or field) areas of the bulk substrate. Such oxide is typically thermally grown by means of wet oxidation of the bulk silicon substrate at temperatures of around 1000° C. for two to six hours. The oxide grows where there is no masking material over other silicon areas on the substrate. A typical masking material used to cover areas where field oxide is not desired is nitride, such as $Si_3N_4$.

However, at the edges of a nitride mask, some of the oxidant also diffuses laterally immediately therebeneath. This causes oxide to grow under and lift the nitride edges. The shape of the oxide at the nitride edges is that of a slowly tapering oxide wedge that merges into a previously formed thin layer of pad oxide, and has been termed as a "bird's beak". The bird's beak is generally a lateral extension of the field oxide into the active areas of devices. Further process steps etch away part of the bird's beak oxide.

The threshold voltage ($V_T$) of a MOS transistor determines the requirement for turning the MOS transistor on or off. Therefore, it is important to be able to adjust the threshold voltage in designing the MOS transistor. One common method of controlling threshold voltage is through the use of ion implantation (e.g., boron implantation). Because very precise quantities of impurity can be introduced using ion implantation, it is possible to maintain close control of $V_T$. A shallow boron implant into the p-type substrate of an n-channel transistor will make the $V_T$ more positive with increasing dose.

The threshold voltage $V_T$ of a MOS transistor is also affected by gate dimensions. If channel length is long, the influence of the drain and source junctions on the quantity of charge in the channel is minimal. On the other hand, as channel length decreases and approaches the dimensions of the widths of the depletion regions of the source and drain junctions, the depletion regions become an increasing part of the channel-depletion region. Some of the channel-depletion region charge is linked to the charge in the depletion region in the source and drain structures instead of being linked to gate charge. The channel region is depleted in part without any influence of gate voltage. Therefore, because some of the channel is depleted without a gate bias, less gate charge is necessary to invert the channel in short channel devices than in a long channel device of comparable substrate doping.

To be able to establish slightly positive $V_T$ values, such as under one volt, in long-channel NMOS transistors with lightly doped substrates, it is necessary to increase the doping concentration at the surface of the channel which is done by a boron implant, typically through the sacrificial oxide or gate oxide.

There is a parameter in a static memory cell called beta ratio, which is approximately equal to:

$$[(pulldownW/pulldownL)/(accessW/accessL)]$$

where pulldownW is the effective electrical width of the active area of a pulldown transistor in the static memory cell; where pulldownL is the effective electrical length of the gate of the pulldown transistor in the memory cell; where accessW is the effective electrical width of the active area of an access transistor in the static memory cell; and where accessL is the effective electrical length of the gate of the access transistor in the static memory cell. This beta ratio is required to be above a predetermined value, such as 3.0, for stable operation of the static memory cell.

It is, of course, desirable to reduce the size of a static memory cell. Typically, to minimize the cell size, the accessW and pulldownL are set at the minimum values as defined by the process capability. Thus, it is necessary to increase accessL and/or pulldownW to maintain an acceptable beta ratio.

SUMMARY OF THE INVENTION

The invention provides an SRAM cell including an n-type access transistor having a reduced effective electrical width (accessW). This permits the size of the entire SRAM cell to be reduced, while maintaining an acceptable beta ratio. The reduction in effective electrical width of the access transistor is accomplished by performing a p-type $V_T$ ion implant into the n-channel active area of the access transistor using a field oxide bird's beak as an implant mask to concentrate the $V_T$ implant in a central region of the active area.

In accordance with one aspect of the invention, a semiconductor processing method of forming a static random access memory cell having an n-channel access transistor comprises:

providing a bulk semiconductor substrate;

patterning the substrate for definition of field oxide regions and active area regions for the n-channel access transistor;

subjecting the patterned substrate to oxidizing conditions to form a pair of field oxide regions and an intervening n-channel access transistor active area therebetween, the field oxide regions having respective bird's beak regions extending into the n-channel access transistor active area, the n-channel access transistor active area defining a central region away from the bird's beak regions; and conducting a p-type $V_T$ ion implant into the n-channel active area using the field oxide bird's beak regions as an implant mask to concentrate the $V_T$ implant in the central region of the active area.

In accordance with another aspect of the invention, a semiconductor processing method of forming a static random access memory cell having an n-channel access transistor comprises:

providing a bulk semiconductor substrate;

providing a pad oxide layer on the substrate;

patterning the substrate, using a silicon nitride mask, for definition of field oxide regions and active area regions for the n-channel access transistor;

subjecting the patterned substrate to LOCOS oxidizing conditions to form a pair of field oxide regions and an intervening n-channel access transistor active area between the field oxide regions, the field oxide regions having respective bird's beak regions extending into the n-channel access transistor active area, the n-channel access transistor active area defining a central region away from the bird's beak regions;

stripping the silicon nitride mask;

patterning photoresist using a mask to regions outside the access transistor active area;

conducting a p-type $V_T$ ion implant into the n-channel active area using the field oxide bird's beak regions as an implant mask to concentrate the $V_T$ implant in the central region of the active area;

conducting a germanium implant into the n-channel active area using the field oxide bird's beak regions as an implant mask to limit diffusion of the $V_T$ implant;

stripping the photoresist;

stripping the pad oxide;

growing a sacrificial gate oxide;

conducting a p-type $V_T$ ion implant into the n-channel active area through the sacrificial gate oxide;

stripping the sacrificial gate oxide; and growing a final gate oxide.

In accordance with another embodiment of the semiconductor device comprises:

a substrate;

a static random access memory cell on the substrate, the static random access memory cell including an n-type access transistor; and field oxide surrounding the access transistor, the access transistor having an active area including a central region and a peripheral region with respect to the field oxide, the access transistor having a p-type $V_T$ ion implant which is more concentrated in the central region than in the peripheral region.

In accordance with another embodiment semiconductor device comprises:

a substrate;

an n-type transistor on the substrate; and field oxide surrounding the transistor, the transistor having an active area including a central region and a peripheral region with respect to the field oxide, the transistor having a p-type $V_T$ ion implant which is more concentrated in the central region than in the peripheral region.

In accordance with another embodiment of the invention, a semiconductor processing method of forming a transistor comprises:

providing a bulk semiconductor substrate;

patterning the substrate for definition of field oxide regions and active area regions for the transistor;

subjecting the patterned substrate to oxidizing conditions to form a pair of field oxide regions and an intervening transistor active area therebetween, the field oxide regions having respective bird's beak regions extending into the transistor active area, the transistor active area defining a central region away from the bird's beak regions; and conducting an ion implant into the transistor active area using the field oxide bird's beak regions as an implant mask to concentrate the implant in the central region of the active area.

BRIEF DESCRIPTION OF THE DRAWINGS

Preferred embodiments of the invention are described below with reference to the following accompanying drawings.

FIG. 1 is a circuit schematic of a static memory cell.

FIG. 2 is a circuit schematic of an alternative static memory cell.

FIG. 12 is a view of the FIG. 3 wafer shown at a processing step subsequent to that of FIG. 11.

FIG. 13 is a view of the FIG. 3 wafer shown at a processing step subsequent to that of FIG. 12.

FIG. 14 is a view of the FIG. 3 wafer shown at a processing step subsequent to that of FIG. 13.

DETAILED DESCRIPTION OF THE PREFERRED EMBODIMENTS

Figure 3:
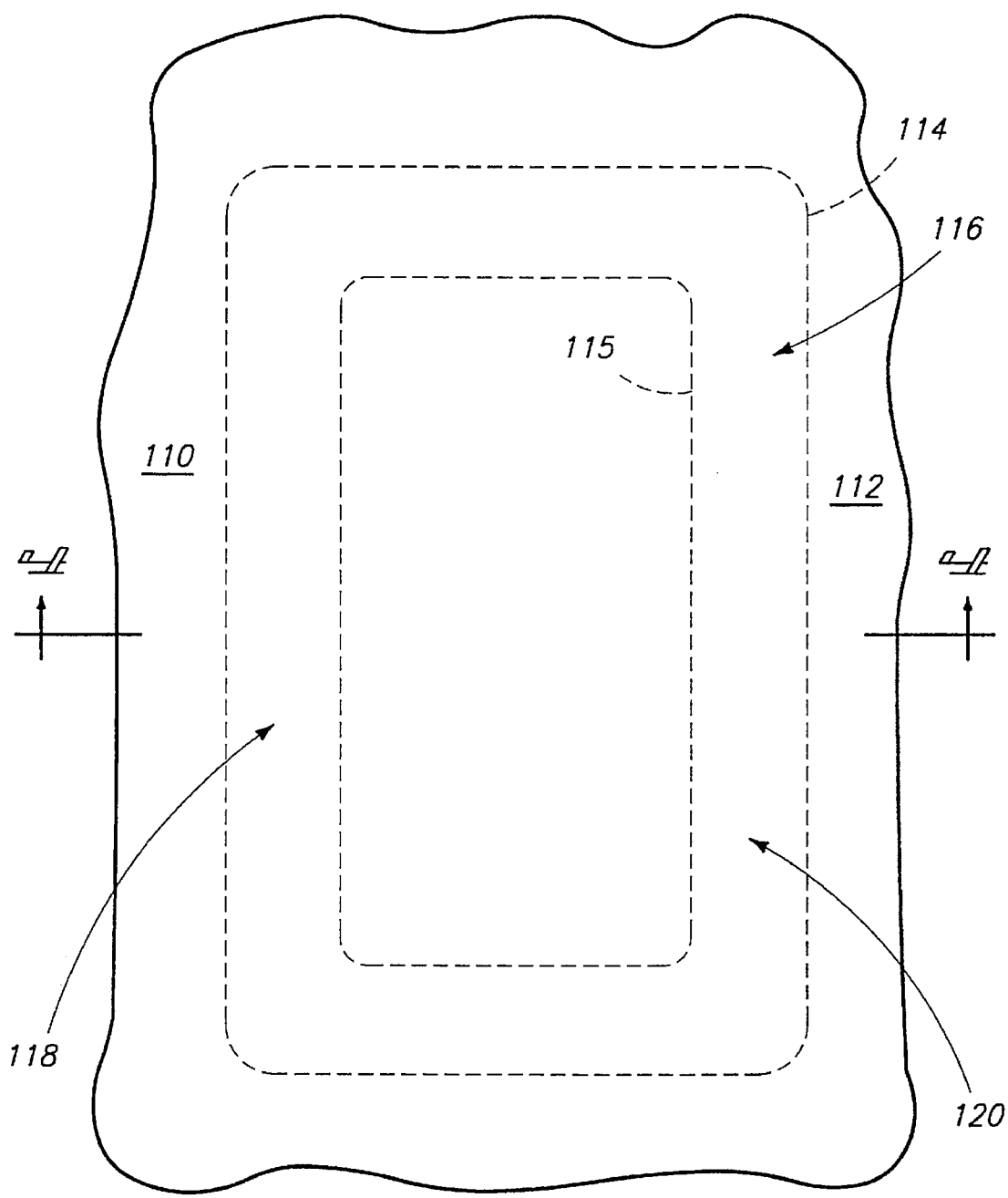
FIG. 3 is a diagrammatic top view of a wafer fragment at one processing step in accordance with the invention.

This disclosure of the invention is submitted in furtherance of the constitutional purposes of the U.S. Patent Laws "to promote the progress of science and useful arts" (Article 1, Section 8).

A static memory cell 10 is illustrated in FIG. 1 which embodies the invention. Static memory cell 10 generally comprises first and second inverters 12 and 14 which are cross-coupled to form a bistable flip-flop. Inverters 12 and 14 are formed by n-channel pulldown (driver) transistors 16 and 17, and p-channel lead (pullup) transistors 18 and 19. Transistors 16 and 17 are typically metal oxide silicon field effect transistors (MOSFETs) formed in an underlying silicon semiconductor substrate. P-channel transistors 18 and 19 can be thin film transistors formed above the driver transistors or bulk devices.

The source regions of driver transistors 16 and 17 are tied to a low reference or circuit supply voltage, labelled $V_{ss}$, and typically referred to as "ground." Load transistors 18 and 19 are connected in series between a high reference or circuit supply voltage, labelled $V_{cc}$, and the drains of the corresponding driver transistors 16 and 17. The gates of lead transistors 18 and 19 are connected to the gates of the corresponding driver transistors 16 and 17.

Inverter 12 has an inverter output 20 formed by the drain of driver transistor 16. Similarly, inverter 14 has an inverter output 22 formed by the drain of driver transistor 17. Inverter 12 has an inverter input 24 formed by the gate of driver transistor 16. Inverter 14 has an inverter input 26 formed by the gate of driver transistor 17.

The inputs and outputs of inverters 12 and 14 are cross-coupled to form a flip-flop having a pair of complementary two-state outputs. Specifically, inverter output 20 is cross-coupled to inverter input 26, and inverter output 22 is cross-coupled to inverter input 24. In this configuration, inverter outputs 20 and 22 form the complementary two-state outputs of the flip-flop.

A memory flip-flop such as that described typically forms one memory element of an integrated array of static memory elements. A plurality of access transistors, such as access transistors 30 and 32, are used to selectively address and access individual memory elements within the array. Access transistor 30 has one active terminal connected to cross-coupled inverter output 20. Access transistor 32 has one active terminal connected to cross-coupled inverter output 22. A pair of complementary column lines 34 and 36 shown, are connected to the remaining active terminals of access transistors 30 and 32, respectively. A row line 38 is connected to the gates of access transistors 30 and 32.

Reading static memory cell 10 requires activating row line 38 to connect inverter outputs 20 and 22 to column lines 34 and 36. Writing to static memory cell 10 requires complementary logic voltage on column lines 34 and 36 with row line 38 activated. This forces the outputs to the selected logic voltages, which will be maintained as long as power is supplied to the memory cell, or until the memory cell is reprogrammed.

At least one of the access transistors 30 and 32 is formed using the method described below starting with the description of FIG. 3.

Shown in FIG. 2 is an alternative static memory cell 50 embodying the invention. Static memory cell 50 comprises n-channel pulldown (driver) transistors 80 and 82 having drains respectfully connected to load elements or resistors 84 and 86. Transistors 80 and 82 are typically metal oxide silicon field effect transistors (MOSFETs) formed in an underlying silicon semiconductor substrate.

The source regions of transistors 80 and 82 are tied to a low reference or circuit supply voltage, labelled $V_{ss}$ and typically referred to as "ground." Resistors 84 and 86 are respectively connected in series between a high reference or circuit supply voltage, labelled $V_{cc}$, and the drains of the corresponding transistors 80 and 82. The drain of transistor 82 is connected to the gate of transistor 80 by line 76, and the drain of transistor 80 is connected to the gate of transistor 82 by line 74 to form a tip-flop having a pair of complementary two-state outputs.

A four transistor memory element, such as that described above in connection with FIG. 2, typically forms one memory element of an integrated array of static memory elements. A plurality of access transistors, such as access transistors 90 and 92, are used to selectively address and access individual memory elements within the array. Access transistor 90 has one active terminal connected to the drain of transistor 80. Access transistor 92 has one active terminal connected to the drain of transistor 82. A pair of complementary column lines 52 and 54 shown, are connected to the remaining active terminals of access transistors 90 and 92, respectively. A row line 56 is connected to the gates of access transistors 90 and 92.

Reading static memory cell 50 requires activating row line 56 to connect outputs 68 and 72 to column lines 52 and 54. Writing to static memory cell 10 requires complementary logic voltages on column lines 52 and 54 with row line 56 activated. This forces the outputs to the selected logic voltages, which will be maintained as long as power is supplied to the memory cell, or until the memory cell is reprogrammed.

At least one of the access transistors 90 and 92 is formed using the method described below.

A semiconductor processing method of forming a static random access memory cell is shown in FIGS. 3–16. The method comprises forming an n-channel access transistor, by performing the following steps.

Figure 4:
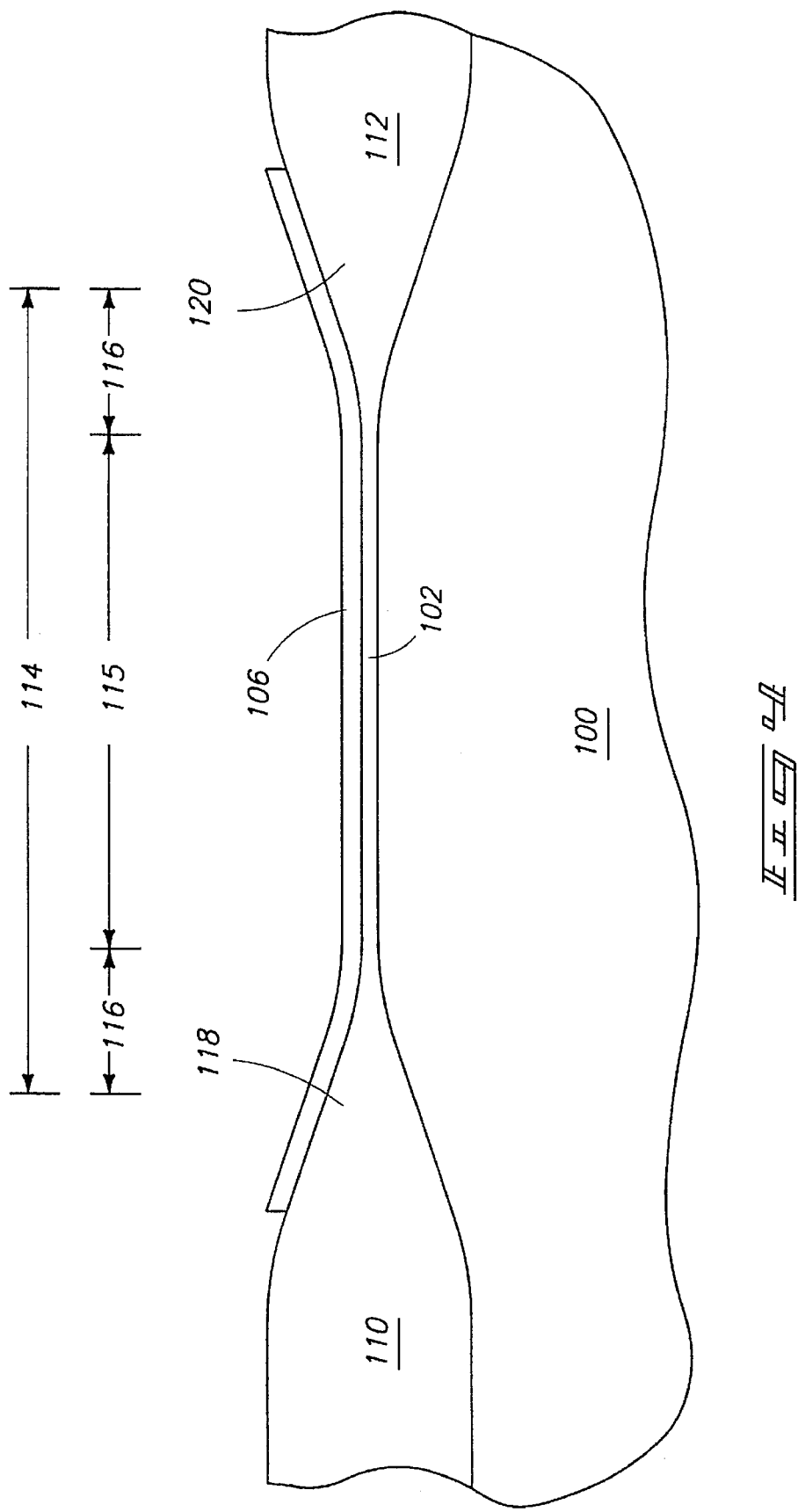
FIG. 4 is a sectional view taken along line 4—4 of FIG. 3.

As illustrated in FIG. 4, a bulk semiconductor substrate 100 is provided. In the illustrated embodiment, the substrate is a p-substrate. The substrate 100 is cleaned, and a pad oxide layer 102 is thermally grown or deposited on the substrate by CVD (Chemical Vapor Deposition). In the illustrated embodiment, the pad oxide layer 102 comprises 10–40 nm of $SiO_2$. The purpose of the pad oxide layer 102 is to cushion the transition of stresses between the substrate and subsequently deposited material during field oxidation.

The substrate 100 is then patterned for definition of field oxide regions and active area regions for the n-channel access transistor. More particularly, masking material 106 is used to cover areas where field oxide is not desired. In the illustrated embodiment, the masking material 106 is a 100–200 nm thick layer of CVD silicon nitride. Silicon nitride is selected as a masking material because oxygen and water vapor diffuse very slowly through it, thus preventing oxidizing species from reaching the silicon surface under the nitride.

The patterned substrate is then subjected to oxidizing conditions to form a pair of field oxide regions 110 and 112, and an intervening n-channel access transistor active area 114 between the field oxide regions 110 and 112. More particularly, the substrate is subjected to LOCOS isolation. LOCOS isolation (LOCal Oxidation of Silicon) involves the formation of a semi-recessed oxide in the non-active (or field) areas of the bulk substrate. The oxide is thermally grown by means of wet oxidation of the bulk silicon substrate at temperatures of around 1000° C. for two to six hours. The oxide grows where there is no masking material over other silicon areas on the substrate. The LOCOS isolation results in the formation of peripheral bird's beak regions 118 and 120, which extend into the n-channel access transistor active area 114. The n-channel access transistor active area 114 includes a central region 115, away from the bird's beak regions 118 and 120, and a peripheral region 116 outside the central region 115 (FIG. 3).

Figure 5:
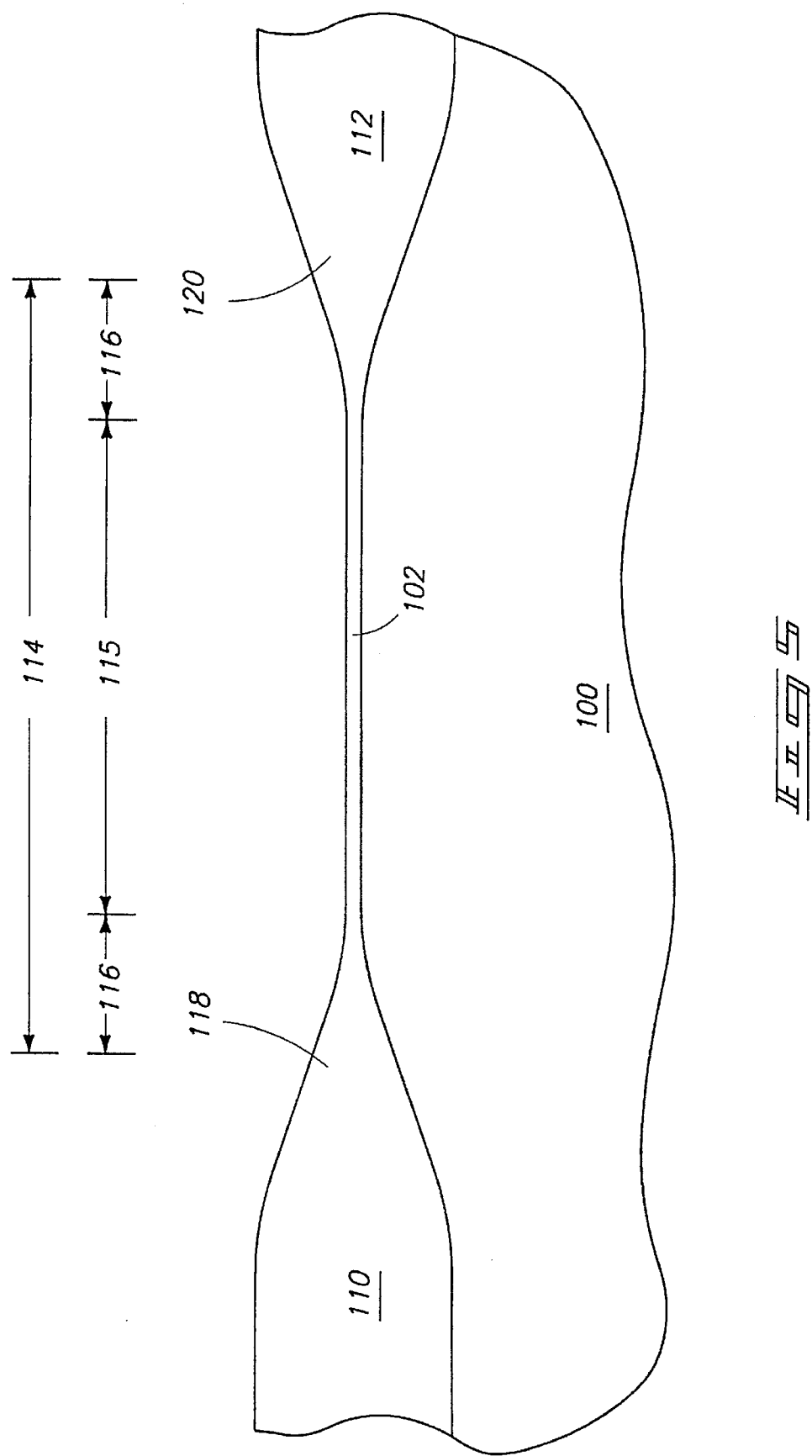
FIG. 5 is a view of the FIG. 3 wafer shown at a subsequent processing step.
Figure 6:
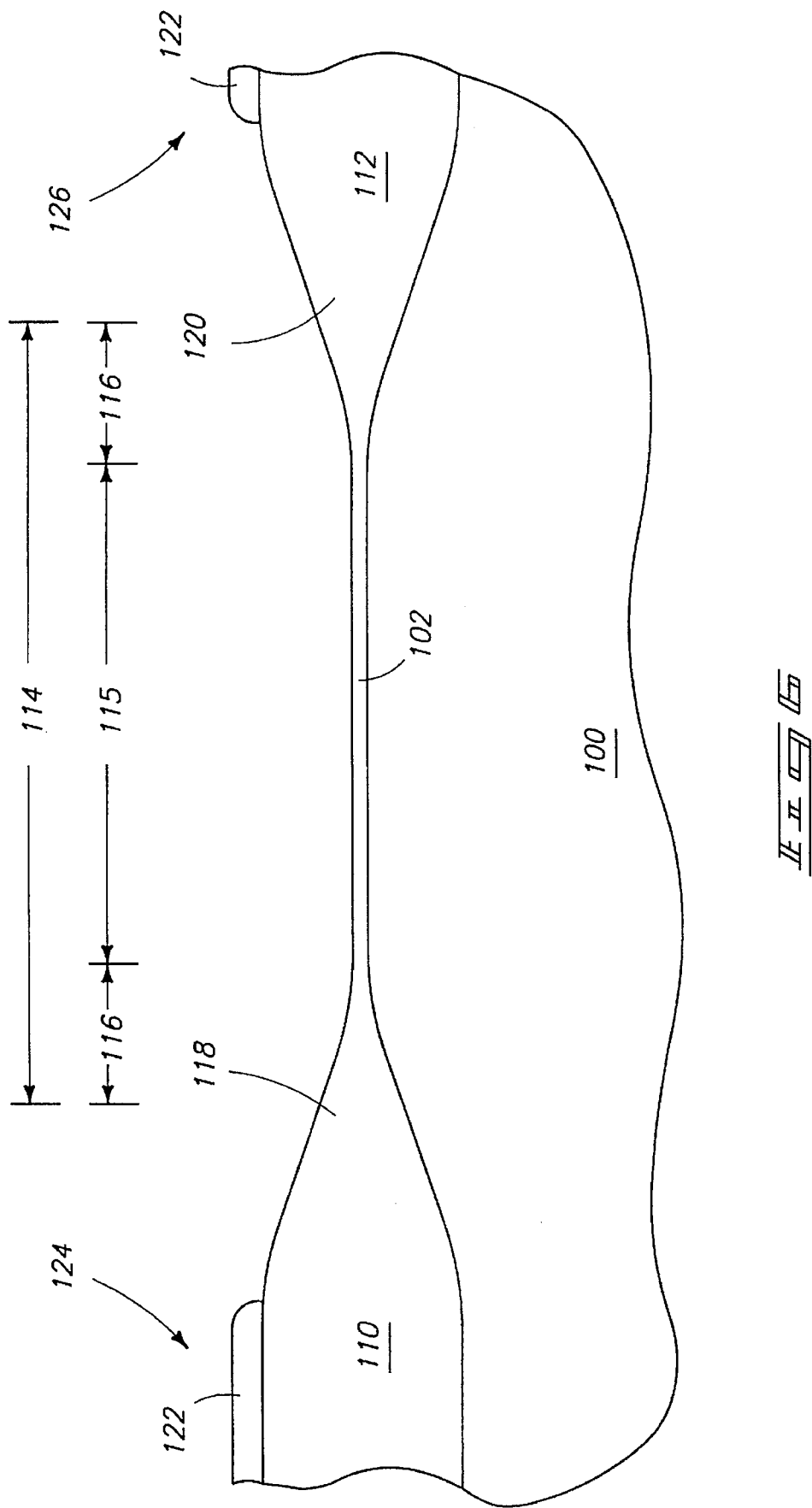
FIG. 6 is a view of the FIG. 3 wafer shown at a processing step subsequent to that of FIG. 5.

After LOCOS isolation is performed, the masking material 106 is stripped (FIG. 5). Photoresist mask 122 is then non-critically applied to mask regions 124 and 126 outside the n-channel access transistor active area 114 (FIG. 6) against a $V_T$ ion implant which is described below.

Figure 7:
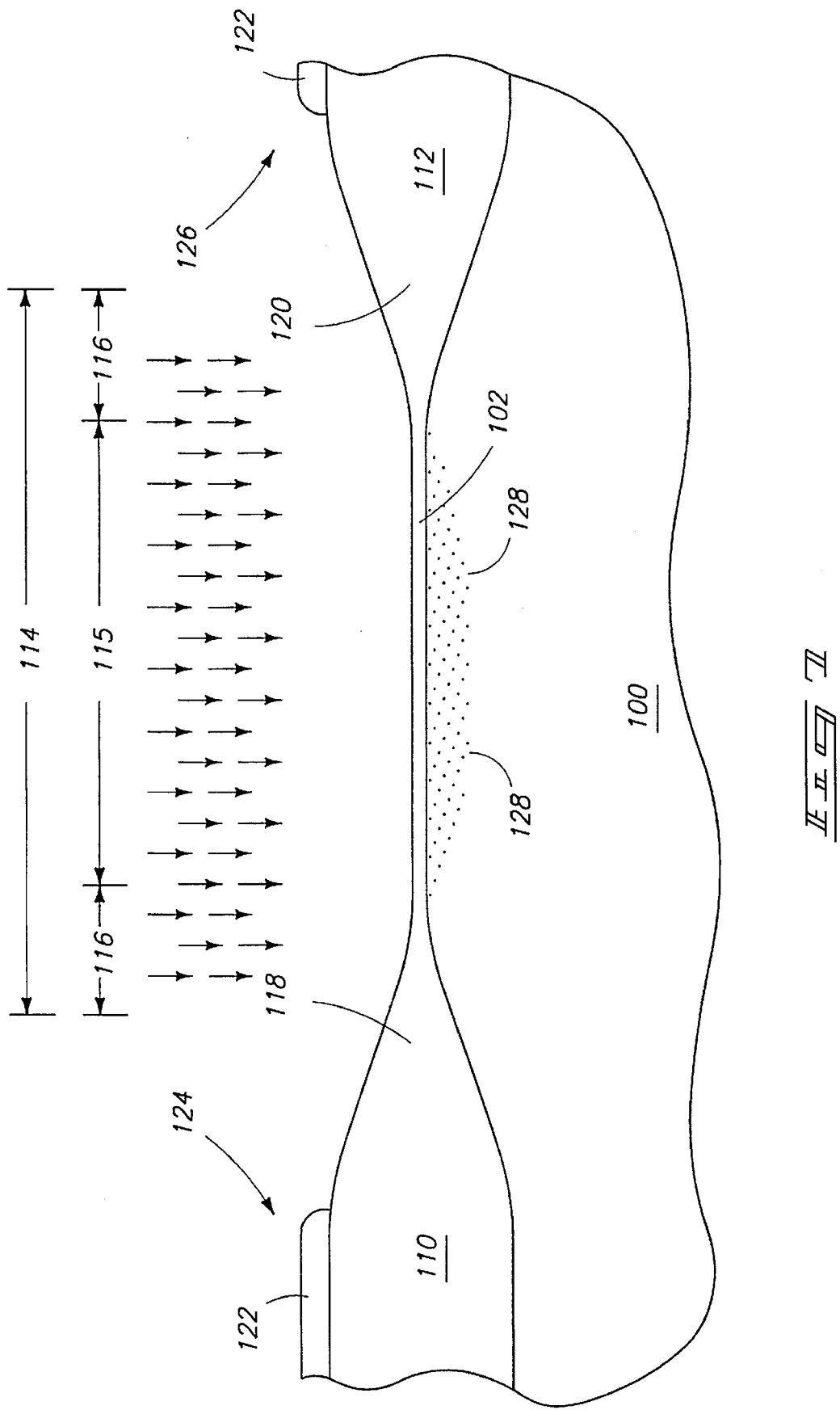
FIG. 7 is a view of the FIG. 3 wafer shown at a processing step subsequent to that of FIG. 6.
Figure 8:
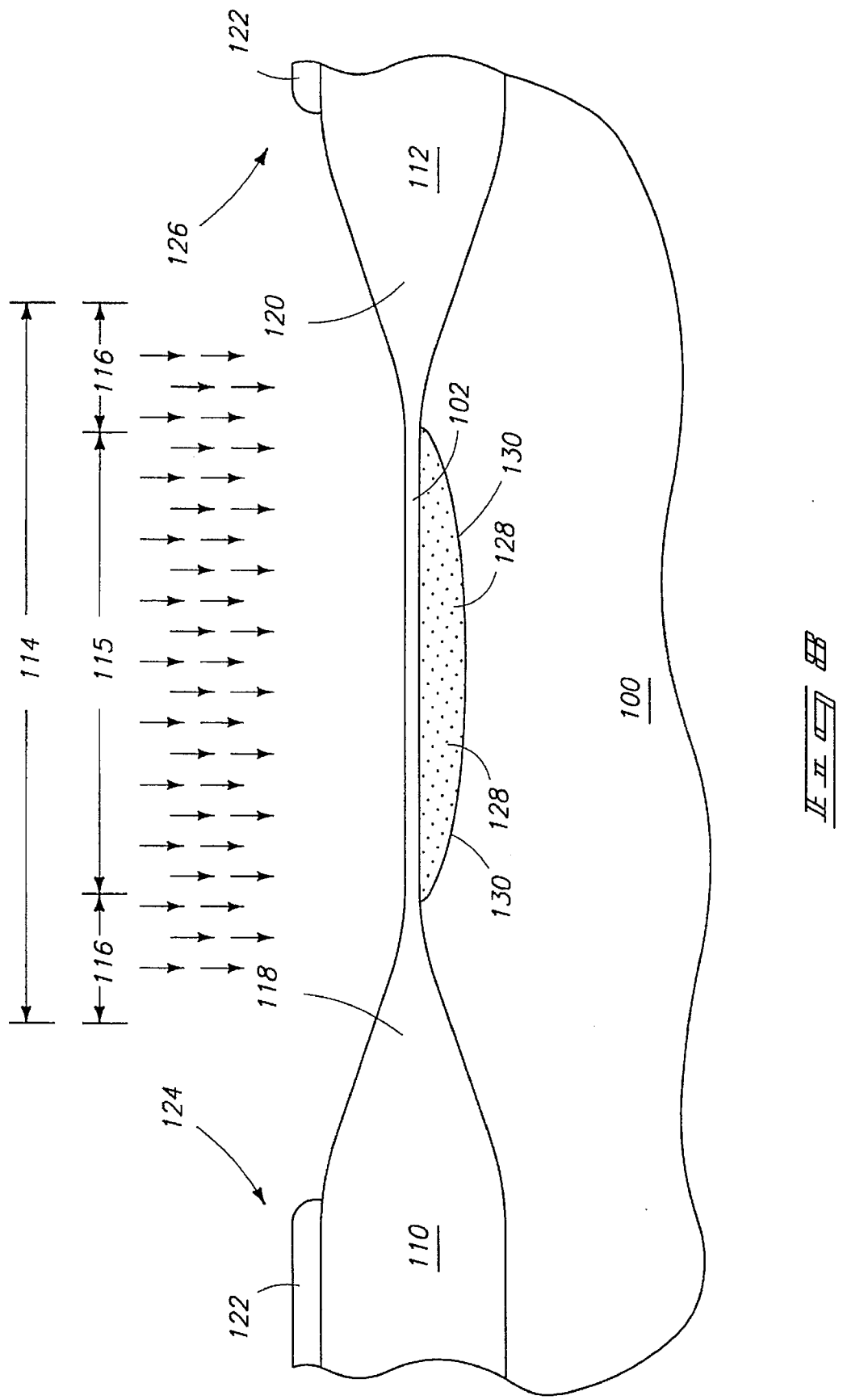
FIG. 8 is a view of the FIG. 3 wafer shown at a processing step subsequent to that of FIG. 7.

After the photoresist is applied, a p-type (e.g., boron) $V_T$ ion implantation into the n-channel active area is performed (FIG. 7). The $V_T$ ion implantation is performed under conditions which enable using the thicker field oxide bird's beak regions as an implant mask, to define a $V_T$ implant 128. This concentrates the $V_T$ implant 128 in the central region of the active area 114, and away from peripheral region 116 (FIG. 3). Implant energy is selected such that ions do not penetrate the exposed field oxide of the bird's beak regions into the substrate.

An example impurity for the $V_T$ implant is boron ($B_{11}$). The boron implantation is preferably performed at low energy; e.g., at between 2 and 8 KeV. The dose of the implanted boron impurity is between $2\times10^{11}$ and $1\times10^{13}$ ions per square centimeter. After implant, the volumetric concentration near the surface of the implanted impurity 128 is approximately between $1\times10^{15}$ and $1\times10^{17}$ ions per cubic centimeter.

An alternative example impurity for the $V_T$ implant is $BF_2$. The $BF_2$ implantation is preferably performed at low energy; e.g., at between 10 and 30 KeV. Because $BF_2$ is a larger molecule than $B_{11}$, more energy can be used to obtain a depth comparable to the depth of $B_{11}$ when $B_{11}$ is implanted. If the same energy were used as would be used for $B_{11}$, a shallower implant would result. Using some commercial implanters, a high energy $BF_2$ implant takes less time than a low energy $B_{11}$ implant. The dose of the implanted $BF_2$ impurity is between $2\times10^{11}$ and $1\times10^{13}$ ions per square centimeter. After implant, the volumetric concentration near the surface of the implanted $BF_2$ impurity is approximately between $1\times10^{15}$ and $1\times10^{17}$ ions per cubic centimeter.

The ion implantation is preferably performed before performing any steps that etch away at the bird's beak regions.

After the $V_T$ implant is performed, an ion implantation is preferably performed using a material which impedes diffusion of the $V_T$ implant. More particularly, in the illustrated embodiment, a germanium ion implantation into the n-channel active area is performed (FIG. 8) to define a germanium implant defined in the figure as a boundary line 130. The germanium implant 130 impedes diffusion of the $V_T$ implant. The germanium implantation is also preferably performed using the field oxide bird's beak regions as an implant mask. The use of germanium implants to retard boron diffusion is described in an article titled "Novel Germanium/Boron Channel-Stop Implantation for Submicron CMOS", by James R. Pfiester and John R. Alvis, 1987, IEEE IEDM Digest, pp. 740–741, which is incorporated herein by reference.

In the illustrated embodiment of the invention, the germanium implantation is performed at between 50 and 200 KeV. In the illustrated embodiment, the dose of the implanted germanium is between $5\times10^{13}$ and $1\times10^{15}$ ions per square centimeter. In the illustrated embodiment, the volumetric concentration of the implanted germanium near the surface is approximately between $1\times10^{17}$ and $5\times10^{20}$ ions per cubic centimeter.

Figure 9:
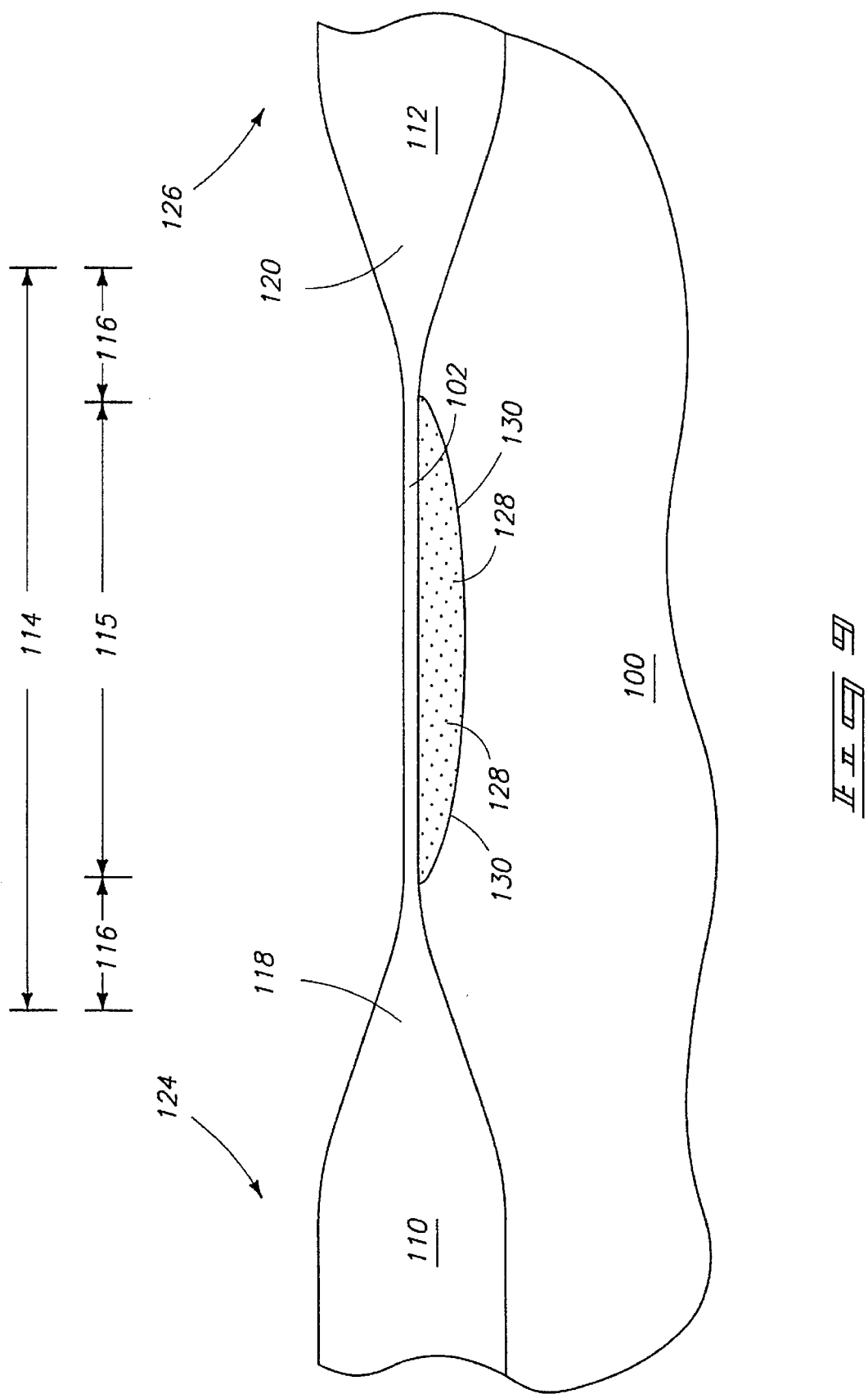
FIG. 9 is a view of the FIG. 3 wafer shown at a processing step subsequent to that of FIG. 8.

After the germanium implant is performed, the photoresist (used to mask regions 124 and 126) is stripped (FIG. 9).

Figure 10:
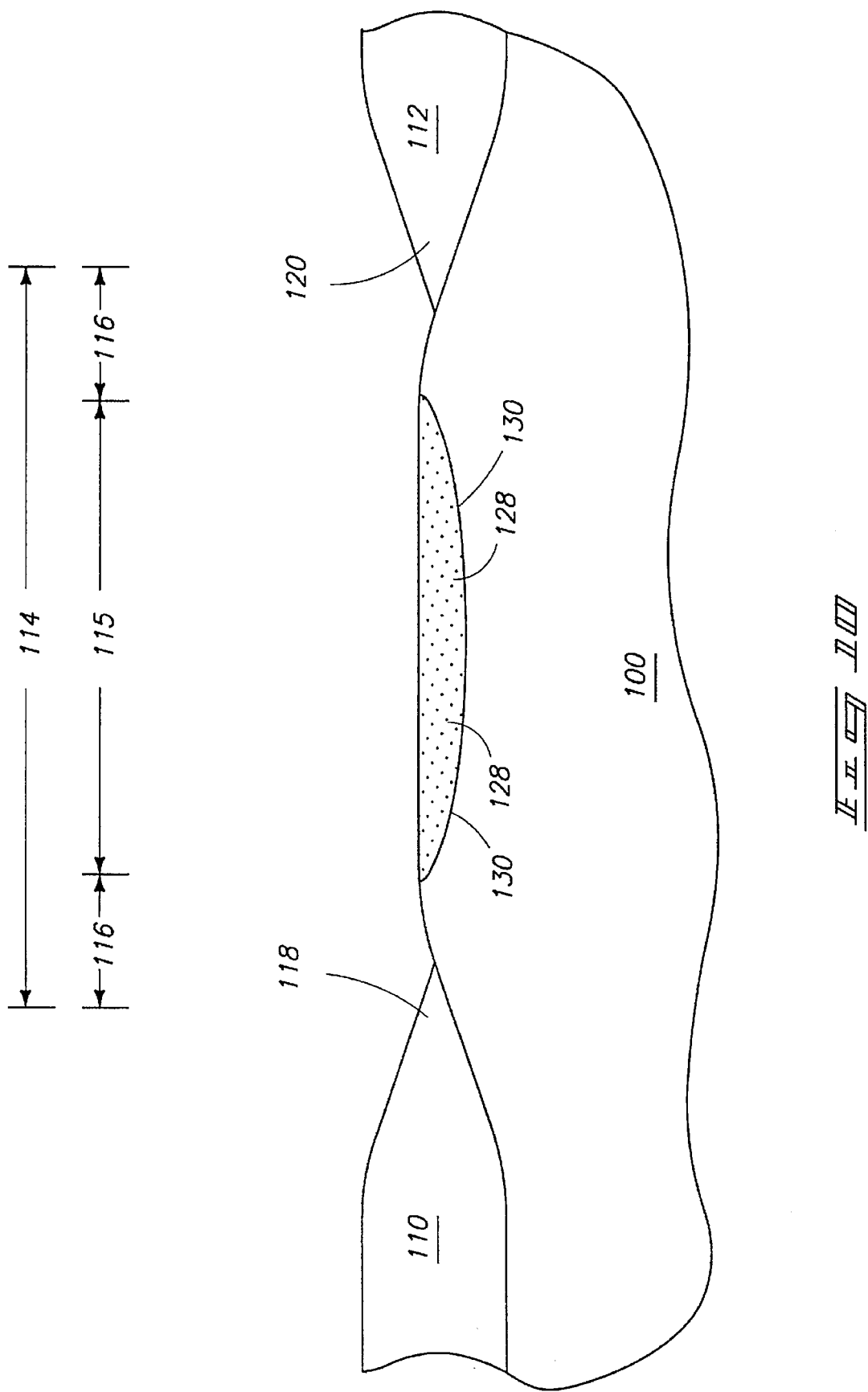
FIG. 10 is a view of the FIG. 3 wafer shown at a processing step subsequent to that of FIG. 9.
Figure 11:
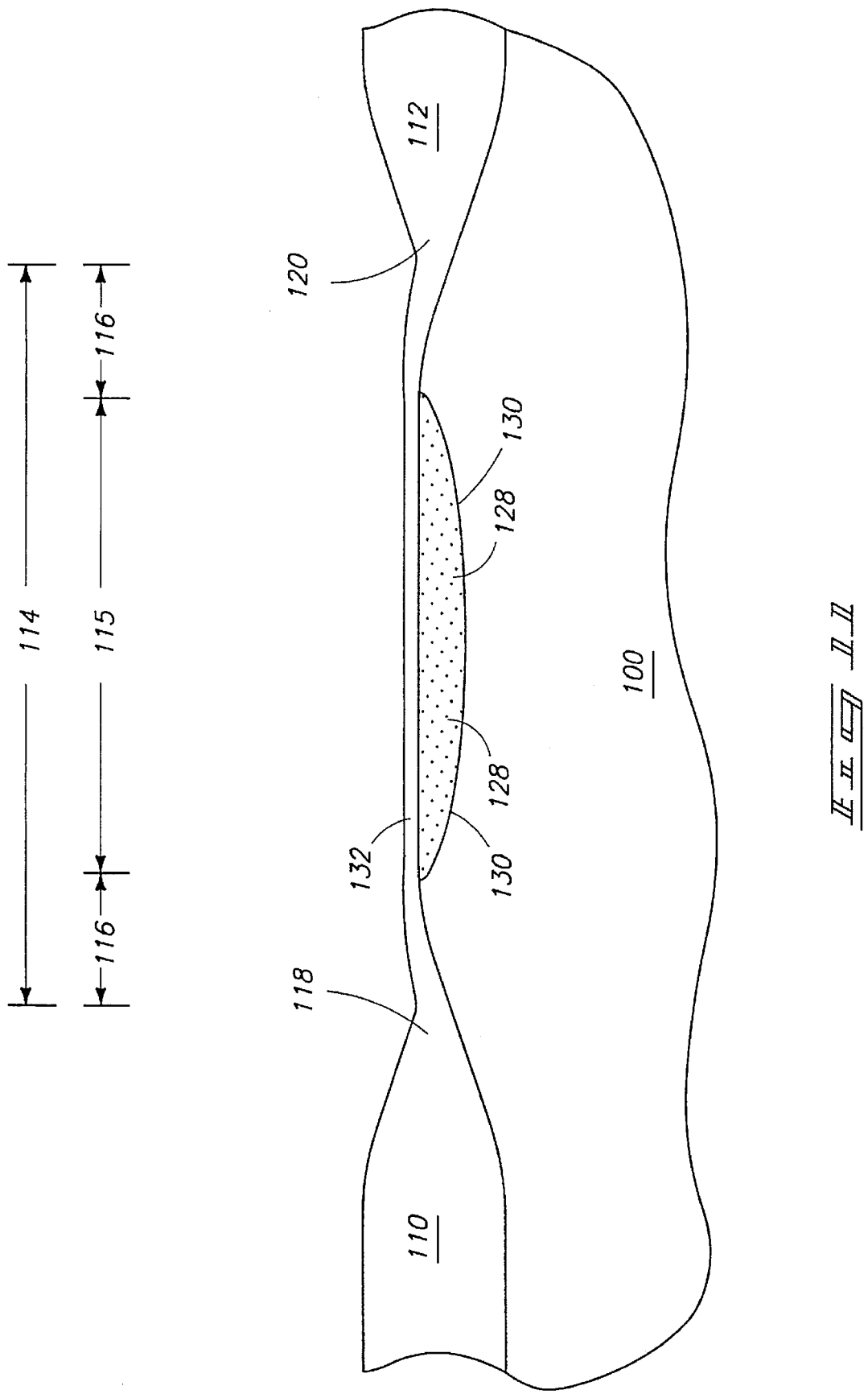
FIG. 11 is a view of the FIG. 3 wafer shown at a processing step subsequent to that of FIG. 10.
Figure 11:
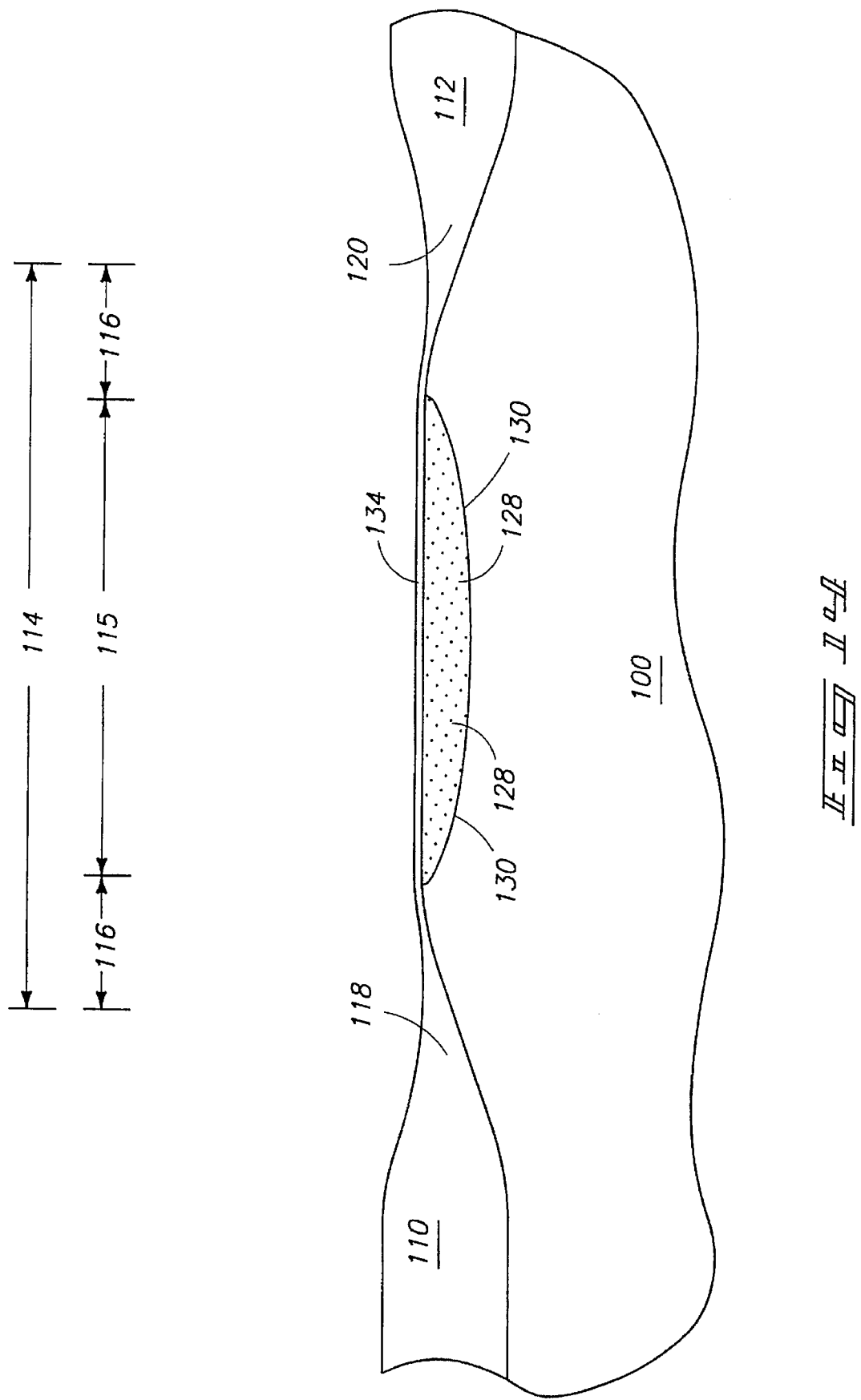

After the photoresist is stripped, the pad oxide 102 is stripped (FIG. 10). This results in the bird's beak regions being stripped back.

After the pad oxide is stripped, a sacrificial oxide 132 is grown (FIG. 11) in view of the Kooi effect. Kooi et al. discovered that $NH_3$ is generated from a reaction between $H_2O$ and masking nitride during field oxidation at the pad-oxide/silicon interface. This $NH_3$ diffuses through the pad oxide and reacts with the silicon substrate to form silicon-nitride spots, which impede the growth of gate oxide and cause low voltage breakdown of the gate oxide. Damage or unwanted nitride is removed by growing (FIG. 11) and later removing the sacrificial oxide 132.

After the sacrificial oxide 132 is grown, a conventional unmasked enhancement implant is performed (FIG. 12). This is another preferred threshold voltage adjust implant ($V_T$ implant), preferably of boron. The implant is an unmasked implant into all transistors on the substrate. The implant can be performed through the oxide 132. This boron implantation is preferably performed at an energy level between 20 and 80 KeV. The dose of the implanted boron impurity is between $1\times10^{12}$ and $1\times10^{13}$ ions per square centimeter. Conventional masked implants, such as a masked depletion implant, may then be performed.

After the enhancement implant and other masked implants are performed, the sacrificial gate 132 is stripped (FIG. 13), resulting in the bird's beak regions being further stripped back.

After the sacrificial oxide is stripped, a final gate oxide 134 is grown (FIG. 14) in the exposed active area 114. In the illustrated embodiment, the final gate oxide 134 is grown through dry oxidation in a chlorine ambient.

Figure 15:
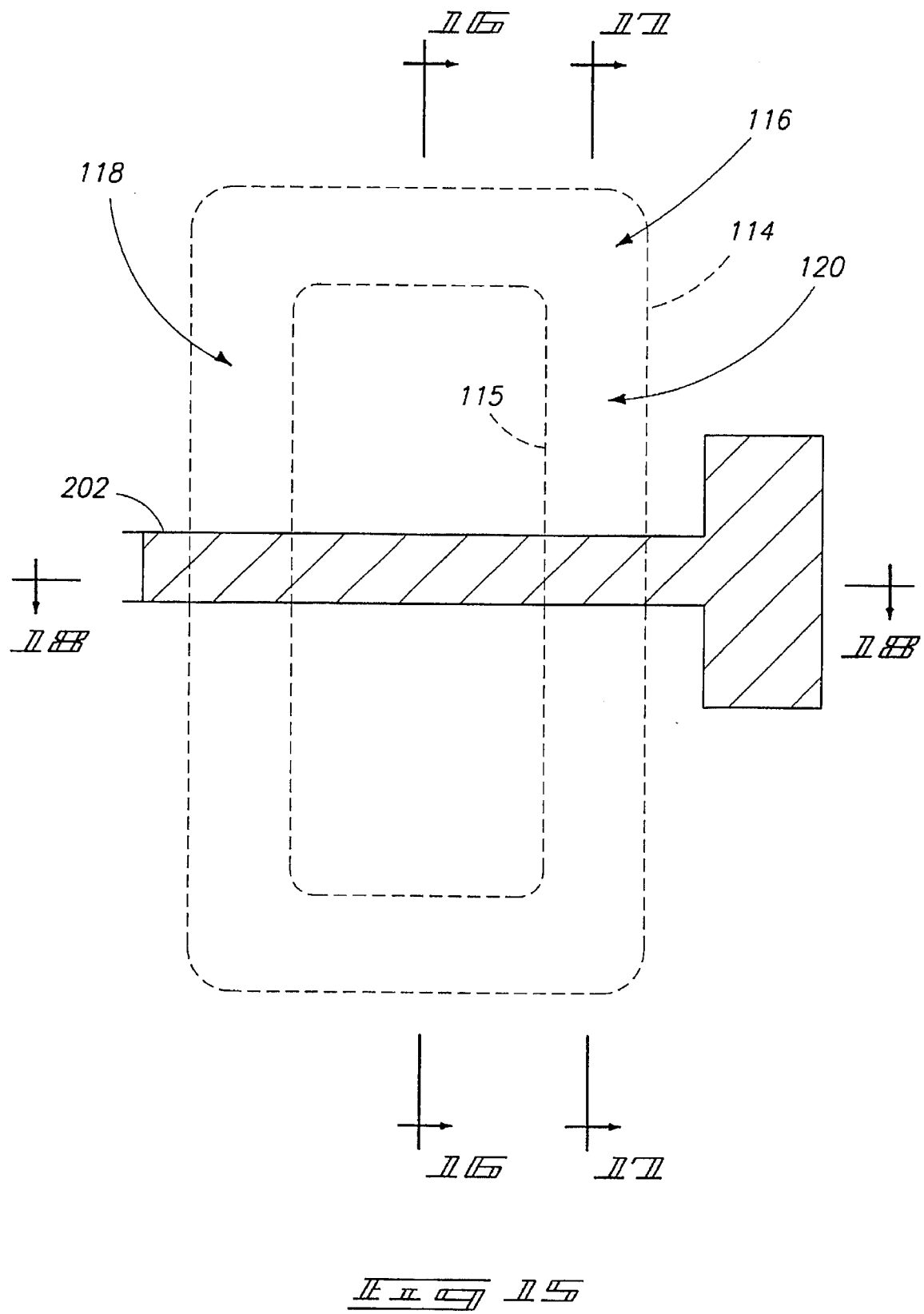
FIG. 15 is a view of the FIG. 3 wafer shown at a processing step subsequent to that of FIG. 14.
Figure 16:
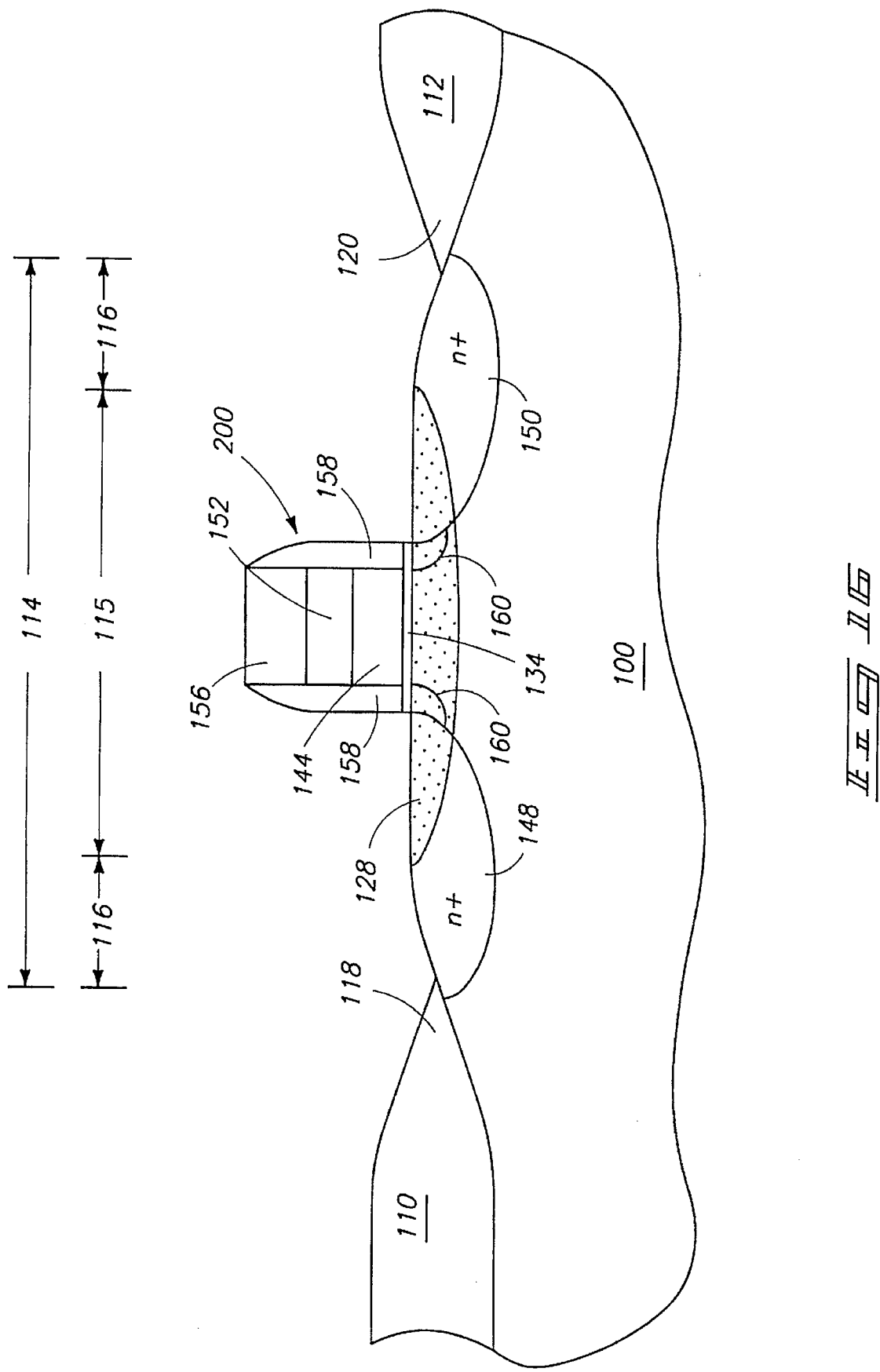
FIG. 16 is a sectional view taken along line 16—16 of FIG. 15.
Figure 17:
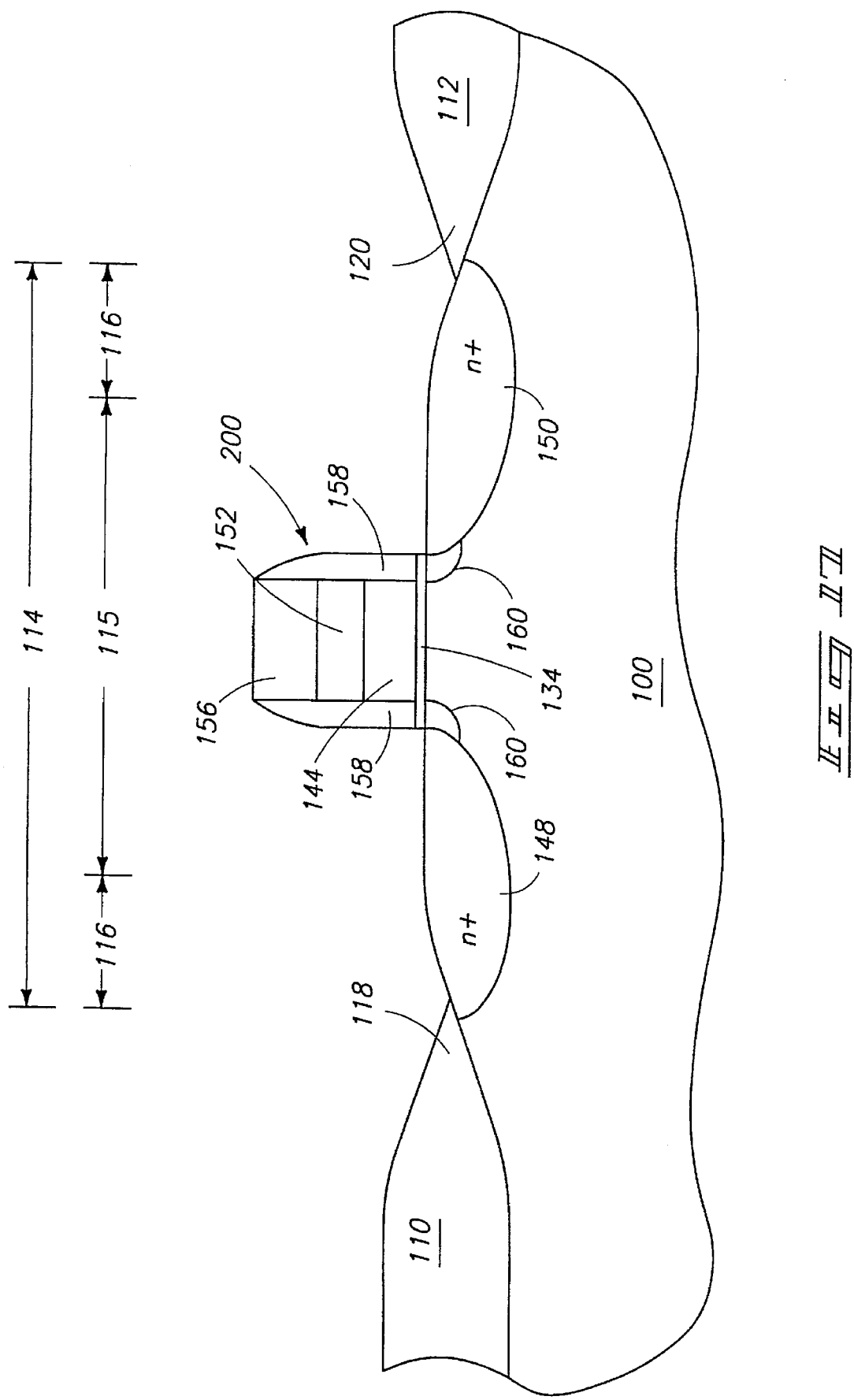
FIG. 17 is a sectional view taken along line 17—17 of FIG. 15.

FIG. 15 is a top view of the wafer after the source and drain regions are formed, and other conventional steps are completed. The completed access transistor is indicated by reference numeral 200 (FIGS. 16–17). Note that because the bird's beak regions have been stripped back by various process steps, central region 115 has a greater $V_T$ concentration then the completed peripheral region 116. FIG. 15 shows row line 202 which can act as row line 38 shown in FIG. 1, or row line 56 shown in FIG. 2.

FIG. 16 is a sectional view taken along line 16—16 of FIG. 15. The row line 202 comprises the gate oxide 134, conductively doped polysilicon region 144, an overlying WSi$_x$ layer 152, and an overlying oxide layer 156 (FIG. 16). Oxide insulating sidewall spacers 158 are also provided relative to the illustrated row line. The completed access transistor 200 further includes source and drain regions 148 and 150, and LDD regions 160.

FIG. 17 is a sectional view taken along line 17—17 of FIG. 15 and illustrates that high $V_T$ does not exist in the peripheral region 116.

Figure 18:
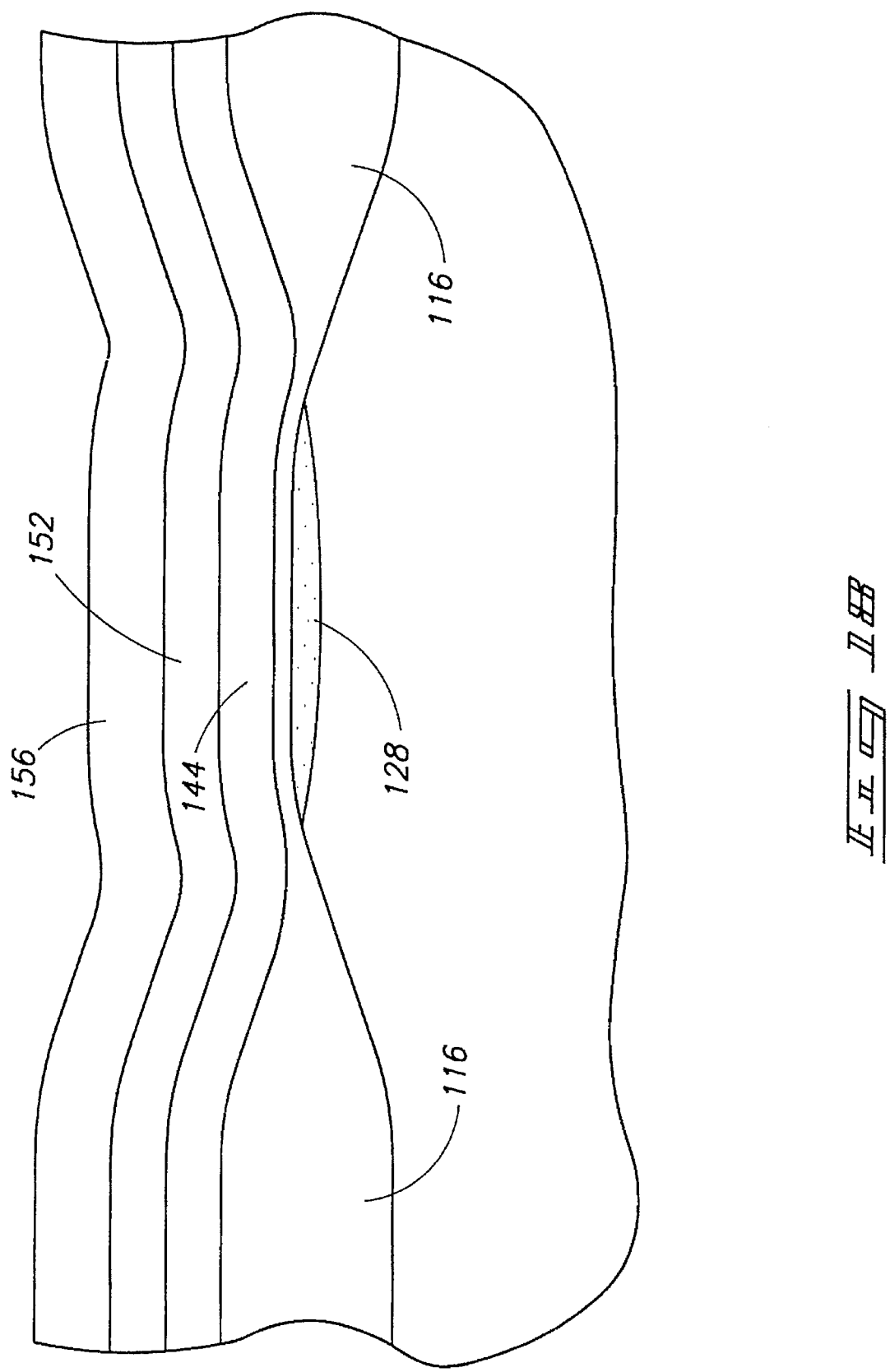
FIG. 18 is a sectional view taken along line 18—18 of FIG. 15.

FIG. 18 is a sectional view taken along line 18—18 of FIG. 15 and shows the centralized location of the $V_T$-implant 128.

Thus, an SRAM cell is provided including an n-type access transistor having a reduced effective electrical width. The size of the entire SRAM cell is reduced, while an acceptable beta ratio is maintained. The reduction in effective electrical width of the access transistor is accomplished by performing a p-type $V_T$ ion implant into the n-channel active area of the access transistor using a field oxide bird's beak as an implant mask to concentrate the $V_T$ implant in a central region of the active area.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of forming a static random access memory cell having an n-channel access transistor, the method comprising the following steps:
   providing a bulk semiconductor substrate;
   patterning the substrate for definition of field oxide regions and active area regions for the n-channel access transistor;
   subjecting the patterned substrate to oxidizing conditions to form a pair of field oxide regions and an intervening n-channel access transistor active area therebetween, the field oxide regions having respective bird's beak regions extending into the n-channel access transistor active area, the n-channel access transistor active area defining a central region away from the bird's beak regions; and
   conducting a p-type $V_T$ ion implant into the n-channel active area using the field oxide bird's beak regions as an implant mask to concentrate the $V_T$ implant in the central region of the active area.

2. A method in accordance with claim 1 and further comprising the step of etching the bird's beak after the ion implant step.

3. A method in accordance with claim 1 wherein the step of subjecting the patterned substrate to oxidizing conditions comprises the step of performing LOCOS isolation.

4. A method in accordance with claim 1 wherein the ion implant step comprises implanting B$_{11}$.

5. A method in accordance with claim 4 wherein the ion implant step is performed at between 2 and 8 KeV.

6. A method in accordance with claim 5 wherein the ion implant step comprises implanting B$_{11}$ at a dose of between $2\times10^{11}$ and $1\times10^{13}$ ions per square centimeter.

7. A method in accordance with claim 6 wherein the ion implant step produces a surface concentration of implanted B$_{11}$ that is between $1\times10^{15}$ and $1\times10^{17}$ ions per cubic centimeter.

8. A method in accordance with claim 1 wherein the ion implant step comprises implanting BF$_2$.

9. A method in accordance with claim 8 wherein the ion implant step is performed at between 10 and 30 KeV.

10. A method in accordance with claim 9 wherein the ion implant step comprises implanting BF$_2$ at a dose of between $2\times10^{11}$ and $1\times10^{13}$ ions per square centimeter.

11. A method in accordance with claim 10 wherein the ion implant step comprises implanting BF$_2$ to produce a surface concentration of implanted BF$_2$ that is between $1\times10^{15}$ and $1\times10^{17}$ ions per cubic centimeter.

12. A method in accordance with claim 1 and further comprising the step of conducting a germanium implant into the n-channel active area using the field oxide bird's beak regions as an implant mask, after performing the $V_T$ implant, to impede diffusion of the $V_T$ implant.

13. A method in accordance with claim 12 wherein the germanium implant step is performed at between 50 and 200 KeV.

14. A method in accordance with claim 13 wherein the germanium implant step comprises implanting germanium at a dose of between $5\times10^{13}$ and $1\times10^{15}$ ions per square centimeter.

15. A method in accordance with claim 14 wherein the germanium implant step produces a surface concentration of implanted germanium that is between $1\times10^{17}$ and $5\times10^{20}$ ions per cubic centimeter.

16. A semiconductor processing method of forming a static random access memory cell having an n-channel access transistor, the method comprising the following sequential steps:
   providing a bulk semiconductor substrate;
   providing a pad oxide layer on the substrate;
   patterning the substrate, using a silicon nitride mask, for definition of field oxide regions and active area regions for the n-channel access transistor;
   subjecting the patterned substrate to LOCOS oxidizing conditions to form a pair of field oxide regions and an intervening n-channel access transistor active area between the field oxide regions, the field oxide regions having respective bird's beak regions extending into the n-channel access transistor active area, the n-channel access transistor active area defining a central region away from the bird's beak regions;
   stripping the silicon nitride mask;
   applying photoresist over the pair of field oxide regions and outside the access transistor active area;
   conducting a p-type $V_T$ ion implant into the n-channel active area using the field oxide bird's beak regions as an implant mask to concentrate the $V_T$ implant in the central region of the active area;
   stripping the photoresist;
   stripping the pad oxide;
   growing a sacrificial gate oxide;

conducting a p-type $V_T$ ion implant into the n-channel active area through the sacrificial gate oxide;

stripping the sacrificial gate oxide; and growing a final gate oxide.

17. A method in accordance with claim 16 wherein the step of conducting a p-type $V_T$ ion implant into the n-channel active area using the field oxide bird's beak regions as an implant mask comprises implanting $B_{11}$.

18. A method in accordance with claim 17 wherein the step of conducting a p-type $V_T$ ion implant into the n-channel active area using the field oxide bird's beak regions as an implant mask is performed at between 2 and 8 KeV.

19. A method in accordance with claim 18 wherein the step of conducting a p-type $V_T$ ion implant into the n-channel active area using the field oxide bird's beak regions as an implant mask comprises implanting $B_{11}$ at a dose of between $2\times10^{11}$ and $1\times10^{13}$ ions per square centimeter.

20. A method in accordance with claim 19 wherein the step of conducting a p-type $V_T$ ion implant into the n-channel active area using the field oxide bird's beak regions as an implant mask comprises implanting $B_{11}$ to produce a surface concentration of implanted $B_{11}$ that is between $1\times10^{15}$ and $1\times10^{17}$ ions per cubic centimeter.

21. A method in accordance with claim 16 wherein the step of conducting a p-type $V_T$ ion implant into the n-channel active area using the field oxide bird's beak regions as an implant mask comprises implanting $BF_2$.

22. A method in accordance with claim 21 wherein the step of conducting a p-type $V_T$ ion implant into the n-channel active area using the field oxide bird's beak regions as an implant mask is performed at between 10 and 30 KeV.

23. A method in accordance with claim 22 wherein the step of conducting a p-type $V_T$ ion implant into the n-channel active area using the field oxide bird's beak regions as an implant mask comprises implanting $BF_2$ at a dose of between $2\times10^{11}$ and $1\times10^{13}$ ions per square centimeter.

24. A method in accordance with claim 23 wherein the step of conducting a p-type $V_T$ ion implant into the n-channel active area using the field oxide bird's beak regions as an implant mask comprises implanting $BF_2$ to produce a surface concentration of implanted $BF_2$ that is between $1\times10^{15}$ and $1\times10^{17}$ ions per cubic centimeter.

25. A semiconductor processing method of forming a transistor, the method comprising the following steps:

providing a bulk semiconductor substrate;

patterning the substrate for definition of field oxide regions and active area regions for the transistor;

subjecting the patterned substrate to oxidizing conditions to form a pair of field oxide regions and an intervening transistor active area therebetween, the field oxide regions having respective bird's beak regions extending into the transistor active area, the transistor active area defining a central region away from the bird's beak regions; and conducting an ion implant into the transistor active area using the field oxide bird's beak regions as an implant mask to concentrate the implant in the central region of the active area.

26. A method in accordance with claim 25 and further comprising the step of etching the bird's beak after the ion implant step.

27. A method in accordance with claim 25 wherein the step of subjecting the patterned substrate to oxidizing conditions comprises the step of performing LOCOS isolation.

28. A method in accordance with claim 25 wherein the transistor is an n-channel transistor, and wherein the ion implant step comprises implanting $B_{11}$.

29. A method in accordance with claim 28 wherein the ion implant step is performed at between 2 and 8 KeV.

30. A method in accordance with claim 28 wherein the ion implant step comprises implanting $B_{11}$ at a dose of between $2\times10^{11}$ and $1\times10^{13}$ ions per square centimeter.

31. A method in accordance with claim 30 wherein the ion implant step comprises implanting $B_{11}$ to produce a surface concentration of implanted $B_{11}$ that is between $1\times10^{15}$ and $1\times10^{17}$ ions per cubic centimeter.

32. A method in accordance with claim 25 wherein the transistor is an n-channel transistor, and wherein the ion implant step comprises implanting $BF_2$.

33. A method in accordance with claim 32 wherein the ion implant step is performed at between 10 and 30 KeV.

34. A method in accordance with claim 33 wherein the ion implant step comprises implanting $BF_2$ at a dose of between $2\times10^{11}$ and $1\times10^{13}$ ions per square centimeter.

35. A method in accordance with claim 34 wherein the ion implant step comprises implanting $BF_2$ to produce a surface concentration of implanted $BF_2$ that is between $1\times10^{15}$ and $1\times10^{17}$ ions per cubic centimeter.

36. A method in accordance with claim 25 and further comprising the step of conducting a germanium implant into the n-channel active area using the field oxide bird's beak regions as an implant mask, after performing the ion implant, to impede diffusion of the ion implant.

37. A method in accordance with claim 36 wherein the germanium implant step is performed at between 50 and 200 KeV.

38. A method in accordance with claim 37 wherein the germanium implant step comprises implanting germanium at a dose of the implanted germanium is between $5\times10^{13}$ and $1\times10^{15}$ ions per square centimeter.

39. A method in accordance with claim 38 wherein the germanium implantation produces a surface concentration of implanted germanium that is between $1\times10^{17}$ and $5\times10^{20}$ ions per cubic centimeter.

* * * * *

UNITED STATES PATENT AND TRADEMARK OFFICE
CERTIFICATE OF CORRECTION

PATENT NO. : 5,650,350
DATED : July 22, 1997
INVENTOR(S) : Charles H. Dennison et al.

It is certified that error appears in the above-indentified patent and that said Letters Patent is hereby corrected as shown below:

Column 5, line 37, replace "lead" with --load--.

Column 5, line 48, replace "lead" with --load--.

Column 6, line 24, replace "respectfully" with --respectively--.

Column 6, line 36, replace "tip-flop" with --flip flop--.

Column 7, line 1, replace "p-substrate" with --p- substrate--.

Signed and Sealed this

Seventh Day of July, 1998

Attest:

BRUCE LEHMAN

Attesting Officer

Commissioner of Patents and Trademarks